United States Patent [19]

Panigrahi

[11] 4,011,548
[45] Mar. 8, 1977

[54] THREE PHASE CHARGE-COUPLED DEVICE MEMORY WITH INHIBIT LINES

[75] Inventor: Godavarish Panigrahi, Piscataway, N.J.

[73] Assignee: Burroughs Corporation, Detroit, Mich.

[22] Filed: July 2, 1975

[21] Appl. No.: 592,401

[52] U.S. Cl. .................. 340/173 CA; 340/173 PP; 357/24
[51] Int. Cl.² ........................................ G11C 11/44
[58] Field of Search ............... 357/24; 340/173 PP, 340/173 CA

[56] References Cited
UNITED STATES PATENTS

| | | | |
|---|---|---|---|
| 3,792,322 | 2/1974 | Boyle et al. | 357/24 |
| 3,858,232 | 12/1974 | Boyle et al. | 357/24 |
| 3,890,633 | 6/1975 | Kosonocky | 357/24 |
| 3,918,997 | 11/1975 | Mohsen et al. | 357/24 |

Primary Examiner—Marshall M. Curtis
Attorney, Agent, or Firm—Larry Michael Jarvis; Franklin D. Ubell; Kevin R. Peterson

[57] ABSTRACT

A charge coupled device shift register memory structure wherein the shift registers may be selectively activated. Each shift register is clocked by a common set of clock phase electrodes. Individual inhibit lines are placed over each shift register channel, and by applying appropriate voltages to these inhibit lines shifting of data in the underlying channel is prevented. In one embodiment, a channel decoder, common source and drain lines and cooperating gating circuitry facilitate read/write and refresh operations.

7 Claims, 5 Drawing Figures

FIG. IA.
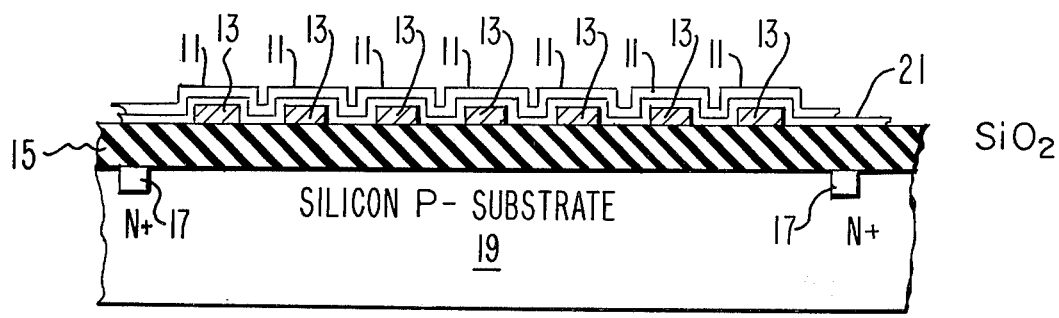
FIG. IB.
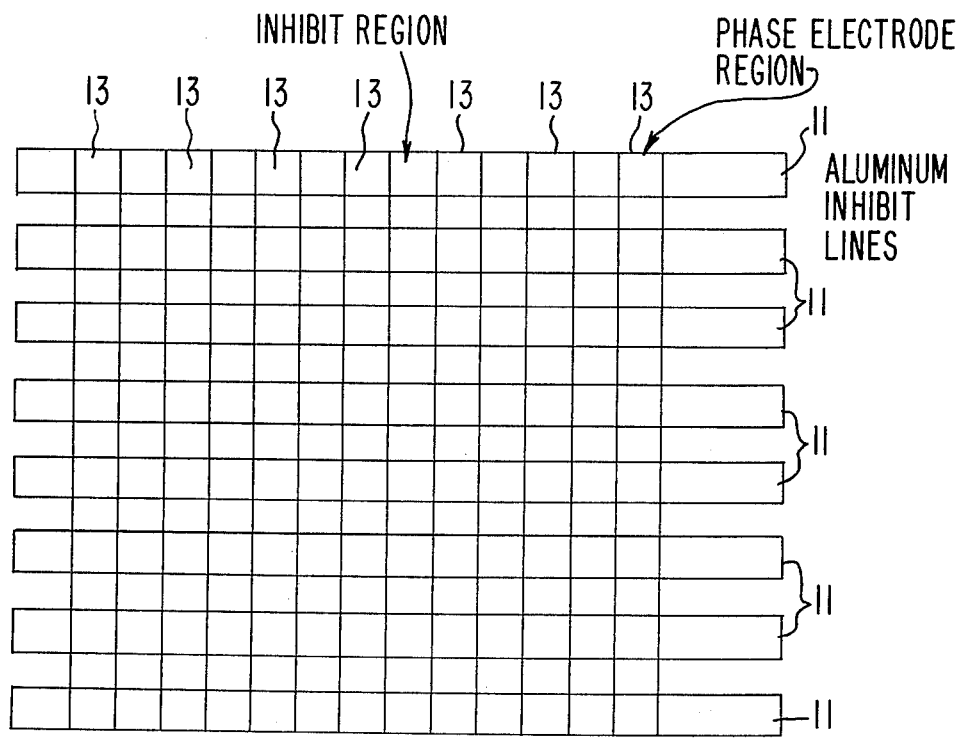

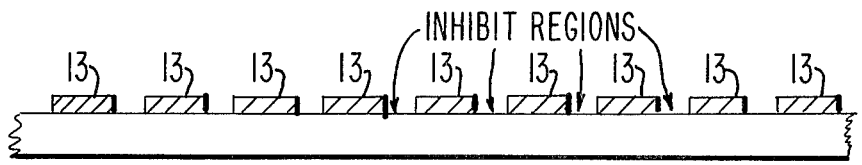
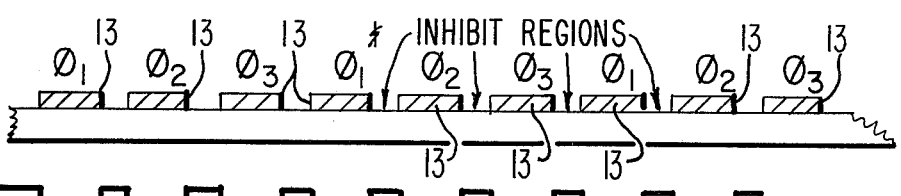

THREE PHASE CHARGE-COUPLED DEVICE MEMORY WITH INHIBIT LINES

BACKGROUND OF THE INVENTION

This invention relates generally to computer memory devices and more particularly to computer memory devices organized from charge coupled device shift registers. The subject invention further relates to a manner of controlling a memory device of three-phase charge coupled device shift registers.

Technology for constructing and operating three-phase charge-coupled device shift registers is now well-known. For example, such technology has been described by W. S. Boyle and G. E. Smith in an article entitled "Charge Coupled Semiconductor Devices" in the Bell System Technical Journal, April 1970, p. 587.

Large scale integrated charge-coupled device memories of high bit density (32K, 64K, or higher) have been generally suggested. In one type of organization, the shift register channels are laid out or "stacked" one after another with channel stoppers in between. Common gate electrode lines for clocking all of the charge-coupled device channels are then laid out perpendicular to the shift register channels. Straight and serpentine layouts of such stacked shift registers have been proposed, the latter being preferred in high-speed memories where closed loops are formed for refreshing. Either the straight or serpentine organizations result in the desired high bit density. However, since all the controlling phase voltages are applied to common gate electrode lines in the prior art, individual shift registers cannot be selectively operated. In addition, such prior art memory organizations have required closely spaced (typically 0.1 mil) electrodes, necessitating stringent photolithographic control.

SUMMARY OF THE INVENTION

It is therefore an object of the invention to provide a charge-coupled device shift register memory device wherein individual shift registers may be selectively operated to enable refresh and data alignment operations in the memory.

It is an additional object of the invention to ease the stringency of photolithographic requirements necessary to fabricate charge coupled device memory systems.

These and other objects and advantages of the invention are accomplished by placing inhibit lines over each charge-coupled device shift register channel in a stack of charge-coupled device shift registers. A proper inhibit voltage creates barriers to charge movement from the potential wells in the charge-coupled device channels. The function of the inhibit lines enables the clocking electrode lines to be separated by distances greater than those utilized in the prior art. A channel decoder may then respond to inputs of read/write and refresh addresses to selectively inhibit desired channels in order to facilitate access, refresh and data alignment operations. Thus, inhibit lines, a special layout of clocking electrodes and properly applied shifting and block potentials provide channel selectivity in the memory device of the subject invention.

An additional advantage that arises from such structure is that the inhibit lines may also be used to apply corrective voltages that compensate for potential wells that arise during fabrication. Such potential wells may occur in three-phase charge-coupled devices with exposed oxide, both of the surface channel and buried channel types.

BRIEF DESCRIPTION OF THE DRAWING

The manner of employing the invention to achieve the above objects and advantages will become more apparent after consulting the following detailed description of the preferred embodiment of the invention read in conjunction with the drawings, of which:

FIGS. 1A and 1B illustrate vertical and horizontal sections of the charge-coupled device shift register memory of the preferred embodiment of the invention.

FIG. 3 illustrates the surface potential in the memory system of the preferred embodiment of the invention during shifting and inhibiting modes of operation.

FIG. 4 illustrates surface potentials in the preferred embodiment of the invention during the storage mode.

DETAILED DESCRIPTION OF THE PREFERRED EMBODIMENT

Figure 2:
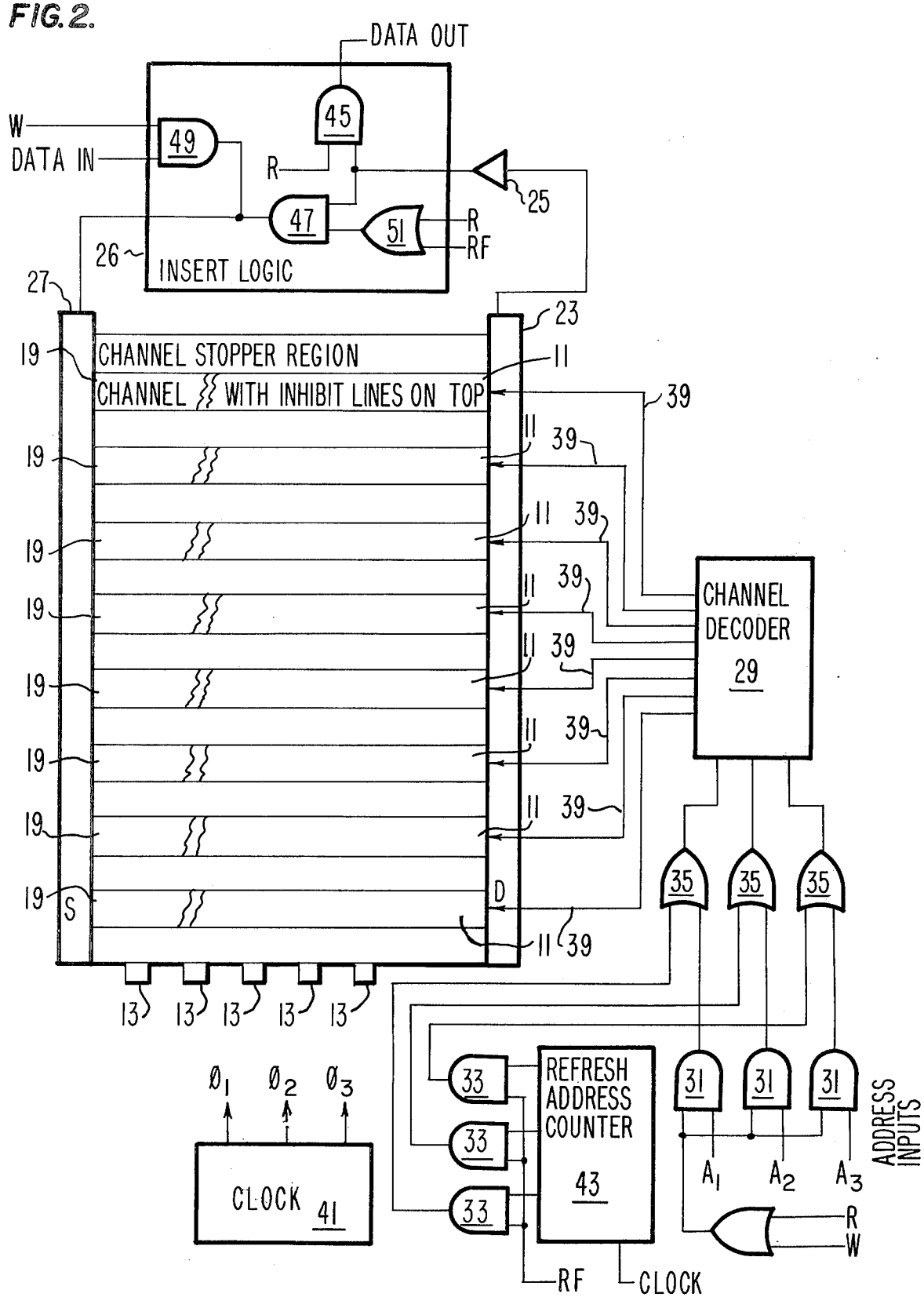
FIG. 2 is a schematic diagram of the memory system of the preferred embodiment of the invention.

FIGS. 1A and B illustrate in vertical and horizontal section the shift register channel and electrode structure employed in the preferred embodiment of the invention. The shift register channel 19 is covered with an oxide layer 15 and provided with N+ sense diffusion regions 17. The oxide layer 15 bears a number of parallel clock phase electrodes 13 of polysilicon or any refractory metal. A second dielectric layer 21, preferably of silicon-oxide or nitride is then deposited over the clock phase electrodes 13. Finally, aluminum inhibit lines 11 are laid out in parallel fashion above each of the shift register channels 19 on top of the second dielectric layer 21. Hence, the aluminum inhibit lines 11 lie in perpendicular relationship to the clock phase electrode lines 13.

The inhibit lines 11 effectively function as a second level of overlapping electrodes that either block or aid in the transfer of charges stored as minority carriers below the clock phase electrodes 13. Whether the lines block or aid charge flow depends on the particular voltage supplied to each of them. As a result, the electrodes 13 need not be so closely spaced as in the prior art. In the preferred embodiment of the invention, the spacing between the first level of electrodes would be typically kept more than 0.1 mil in order to effectively control data movement.

Structure incorporating the charge-coupled device shift register channel and electrode memory layout of FIG. 1A and 1B into a memory device is shown in FIG. 2. Each of the shift register channels 19 is connected to an output drain diffusion and an input source diffusion. The manner of providing these diffusions is well-known in the prior art. The common sense diffusion 23 is connected to the input of a sense amplifier 25, which is strobed to detect an output from the sense diffusion. The common source diffusion 27 is provided to enable writing "1" or "0" into the channels 19. These channels 19 may be n or p type, but are assumed to be n type for purposes of this discussion. For writing "0", a relatively positive voltage, for example 20 volts, is applied to the source diffusion line 27 which then sinks any minority carriers (electrons in an n channel device) present. For writing a "1", a relatively negative voltage, for example ground potential, is applied to the source line 27, which then injects minority carriers into the first storage location of a shift register channel 19.

Neither a "1" or "0" may be written into a particular channel 19 unless that channel 19 is selected by a channel decoder 29.

The channel decoder 29, which may be of a well-known type, decodes an address supplied via several OR gates 35 from read/write addressing AND gates 31 or refresh address counter AND gates 33. The result of the decoding is an output on one of the activating lines 39 of the channel decoder 29. This output removes the inhibition applied to a particular channel 19 by its inhibit line 11. The clock phases supplied by a clock 41 to the clock phase electrodes 13 will then shift the data in the channel 19 selected by the decoder 29. Circulation of the data for refresh and input or output operations is controlled by the gate section 26.

The gate section 26 includes three AND gates 45, 47, 49, which are supplied with appropriate read, write and refresh control signals. The input AND gate 49 outputs to the common source diffusion line 27 and receives inputs from a DATA IN line and a write control signal W. The refresh AND gate 47 receives a first input from the output of the sense amplifier 25 and an additional input from the output of an OR gate 51. OR gate 51 receives inputs of the refresh signal RF and the read signal R. Data is thus fed back in case of a read or refresh operation. The refresh AND gate 47 outputs directly to the common source diffusion line 27. Finally, the output of the sense amplifier 25 is connected to an input of the output AND gate 45, which receives a second input from the read control signal R.

To perform refresh operations, the count of the refresh counter is transferred to the channel decoder 29 via several AND gates 33 when the AND gates 33 are each supplied with the refresh control signal RF. Each time the counter 43 is incremented by a clock input, a new count is supplied to the decoder 29. Each individual count corresponds to a unique address for each shift register channel 19. The decoder 29 then decodes the count to provide an output on one of its lines 39 in order to remove the inhibition on the particular addressed shift register channel.

When the inhibition is removed, the clock phases supplied by the clock 41 will circulate the data in the selected channel 11. The read signal R is held low during a refresh operation, preventing output of circulated data by the output and gate 45. Application of the clock phases then causes the data in the selected channel 11 to circulate through the sense amplifier 25, the refresh AND gate 47 and back into the selected channel 19 via the source diffusion line 27. As each channel 19 is successively addressed by the counter 43, its data is successively circulated for refresh purposes.

To perform read/write operations, channel address bits $A_1$, $A_2$, $A_3$ . . . are supplied as respective first inputs to a series of address AND gates 31. The second input to each of these AND gates 31 is the logical OR of the read and write signals R, W, indicating either a read or write operation is dictated. In such case, the address bits are gated to the decoder via the OR gates 35, and a particular decoder output 39 corresponding to the addressed channel 19 is activated. The clock phases supplied by the clock 41 will then circulate out the data bits stored in the addressed channel 19. If a read operation is dictated, the read AND gate 45 will be enabled by a read control signal R, and data will be read out. If a write operation is dictated, data will be clocked into the addressed channel 19 through the write AND gate 49 enabled by a write signal W. If a "1" bit is represented by a high input to the AND gate 49, it would be necessary to invert the output of AND gate 49 to obtain proper polarity in an n channel device.

While FIG. 2 illustrates eight decoder outputs 39, connected to eight inhibit lines 11, disposed over eight channels 19 and 3-bit addresses, any number of channel inhibit lines, decoder outputs and corresponding addresses can be organized according to the teachings of the invention.

Of course, it is essential that proper potentials be applied to the clock phase electrodes 13 and the inhibit electrodes 11. The potentials applied in the preferred embodiment of the invention in both the shifting and inhibiting modes are shown in FIG. 3. If $2V_s$, $3V_s$, and $4V_s$ (10, 15 and 20 volts respectively) are the potentials under the clock phase electrodes 13, then applying an inhibit voltage of approximately +5 volts or lower to the inhibit lines blocks the charge movement. If a voltage of approximately +15V is applied to the inhibit lines, then the forward charge movement is not impeded. The phase clock voltages have to be properly designed to prohibit any backward flowing of the charges to the potential wells under the inhibit electrodes. Such a prohibition can be achieved by changing the electrode voltages only after the charge transfer has take place. It is sometimes desirable that some charge be left behind, for example, in the "fat - O" mode of operation. The phase voltages and the inhibit line voltage may be properly chosen to accomodate this mode of operation.

If clocks are not being continuously applied to the electrodes 13, a third mode of operation, the storage mode, is utilized. In this mode, constant voltages are applied to both the clock phase lines 13 and the inhibit lines 11. FIG. 4 illustrates two possible combinations of potential profiles during the storage mode and the corresponding voltages necessary. In the first storage mode, the potential under every third clock phase electrode 13 is $3V_s$ or 15V, and the potential under the other clock phase electrodes 13 is $2V_s$ or 10V. The potential under the inhibit regions is commonly maintained at $V_s$ or 5V. In the other illustrated possibility, the potential under every third charge clock phase electrode 13 is $3V_s$ or 15V, and the potential under the other clock phase electrodes 13 and the other inhibit regions is made equal to $V_s$ or 5V.

Thus, the shift register memory of the preferred embodiment can be operated with either a continuous clock or a burst clock. When a continuous clock is applied to all the shift registers, data is shifted only in the shift register channel 19 selected by the inhibit lines 11. When a burst clock of a number of clock cycles equal to the number of bits stored in each shift register 19 is applied to all the shift registers, data is again shifted only in the shift register selected by an activated inhibit line 11. When the burst clock is not applied, the whole memory is held in the storage mode previously discussed.

It should be noted that the actual gate voltage applied will be the sum of the semiconductor surface potential $V_s$ and the voltage across the oxide. All the voltages mentioned herein loosely imply the semiconductor surface potential with no mobile carriers (unfilled wells), and the real voltages applied will be increased correspondingly.

In the preferred embodiment of the invention, the shift registers still operate in the depletion mode. Minority carriers are generated primarily in the depletion regions. During blocking and storage modes, these charges spill over to fill up the potential wells and add to the charge stored as information. During shifting operations all these charges are collected and shifted out.

Many modifications to the above embodiment may be made by one of ordinary skill in the art without departing from the essential concepts of the invention. It is therefore to be understood that, within the scope of the appended claims, the invention may be practiced otherwise than as specifically disclosed.

What is claimed is:

1. A charge coupled device shift register memory structure activatable by a plurality of clock phases produced by a clock generator comprising:
    a plurality of charge coupled device shift register channels for storing data bits in the form of charge packets;
    a thin dielectric layer disposed over each said channel;
    a plurality of parallel gate electrode means disposed perpendicular to said channels upon said dielectric layer for shifting said data bits in said channel in response to said clock phases; and
    means for selectively varying the potential between said plurality of gate electrode means with respect to selected of said shift register channels, for selectively inhibiting or aiding the said clock shifting of said data bits in response to the potential presented by said potential varying means.

2. The memory structure of claim 1 wherein said selectively varying potential means includes:
    a second dielectric layer overlying said gate electrode means; and
    a plurality of potential varying lines, each disposed upon said second dielectric layer and over a respective shift register channel.

3. The memory structure of claim 2 wherein said parallel gate electrode means are separated by a distance greater than 0.1 mil.

4. The memory structure of claim 3 wherein said dielectric layers are silicon dioxide, said gate electrodes are polysilicon and each of said potential varying lines is aluminum.

5. The memory structure of claim 1 and further activatable in response to read and write control signals, at least one refresh indicating signal and an access address presenting a particular selected shift register channel which is to be accessed via said potential varying means and further including:
    commonly connected output means for each said shift register channel;
    commonly connected input means for each said shift register channel;
    decoding means for decoding said access address to vary said potential by said potential varying means in the said particular shift register channel represented by said access address, to perform access thereof; and
    means receiving an input from said commonly connected output means for gating data bits in said particular selected shift register channel out of said memory structure in response to a said read control signal and from said commonly connected output means to said commonly connected input means in response to said at least one refresh indicating signal and for gating data bits into said particular selected channel in response to a write control signal.

6. The memory structure of claim 5 wherein said potential varying means comprises:
    a second dielectric layer overlying said gate electrode means; and
    a plurality of potential varying lines, each disposed upon said second dielectric layer and over a said shift register channel.

7. The memory structure of claim 6 wherein said access address includes a refresh address and a read/write address and said decoding means comprises:
    a channel decoder for decoding said refresh and read/write addresses, said decoder having an input and an output connected to each of said potential varying lines;
    a refresh address counter for developing a plurality of said refresh addresses; and
    address gate means for gating each said refresh address and each said read/write address to the input of said channel decoder.

* * * * *